(12) United States Patent
Bletz et al.

(10) Patent No.: US 6,404,288 B1
(45) Date of Patent: Jun. 11, 2002

(54) TIME BASE GENERATOR

(75) Inventors: Achim Bletz, Tournon sur Rhone; Alexandre Thollet, Saint foy l'argentiere, both of (FR)

(73) Assignee: Krohne A.G. (SE)

( * ) Notice: Subject to any disclaimer, the term of this patent is extended or adjusted under 35 U.S.C. 154(b) by 0 days.

(21) Appl. No.: 09/704,906

(22) Filed: Nov. 2, 2000

(30) Foreign Application Priority Data

Nov. 3, 1999 (DE) .......................................... 199 52 826

(51) Int. Cl.[7] ................................................ H03L 7/07
(52) U.S. Cl. .............................. 331/2; 331/18; 327/147
(58) Field of Search ................................ 331/2, 18, 25; 327/147–150

(56) References Cited

U.S. PATENT DOCUMENTS 4,940,950 A * 7/1990 Helfrick ........................ 331/2
5,028,887 A * 7/1991 Gilmore ....................... 331/18

* cited by examiner

*Primary Examiner*—David Mis
(74) *Attorney, Agent, or Firm*—Cesari and McKenna, LLP

(57) ABSTRACT

An arrangement for generating a first alternating signal and a second alternating signal that is in a predetermined, fixed frequency relation to the first signal. The arrangement may be used as a time based generator for a level meter that operates according to the radar principle and whose measuring system is based on the time domain reflectometry (TDR) measuring principle.

14 Claims, 1 Drawing Sheet

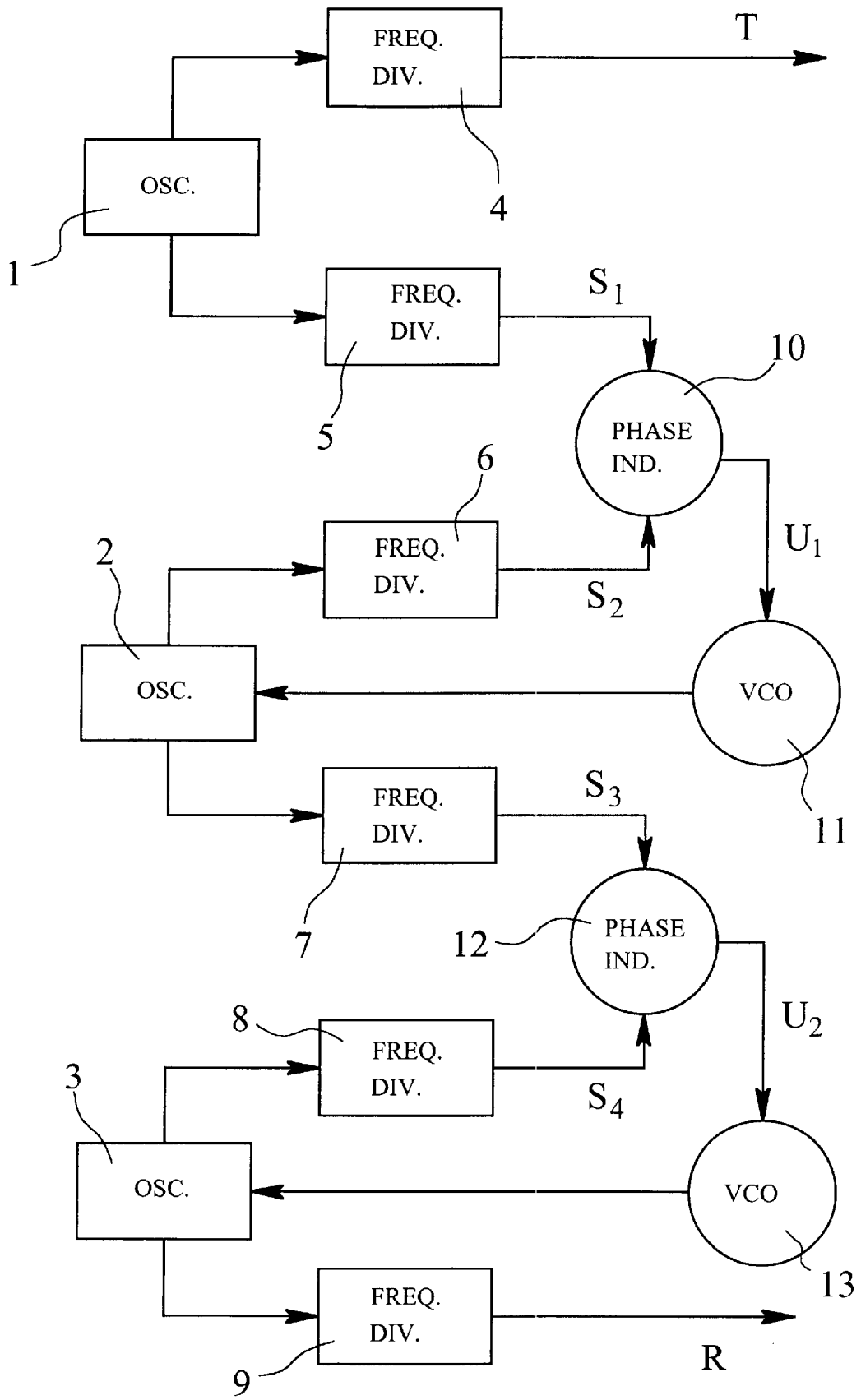

TIME BASE GENERATOR

BACKGROUND OF THE INVENTION

The invention relates to an arrangement for generating a first alternating signal and a second alternating signal that is in a predetermined, fixed frequency relation to the first signal. Such an arrangement is used, for example, as a time base generator for a level meter that operates according to the radar principle and whose measuring system is based on the time domain reflectometry (TDR) measuring principle. The TDR measuring principle is known from the field of cable testing, for example, and shows similarities with the method of operation of radar equipment. In a known TDR level meter, an extremely short electrical pulse carried via two electric conductors running essentially straight is emitted into a container holding a medium such as a liquid, a powder or a granulate, the level of which is to be determined. The short electrical pulse emitted via the two conductors into the container is reflected at the surface of the medium, and the reflected portion of the short electrical pulse is again detected by a measuring transducer of the measure device. The reflected portion of the short electrical pulse depends on the dielectric constant of the medium and increases with it. In this connection, the transition time of the signal is proportional to the distance of the measuring transducer from the surface of the medium in the container. Changing surrounding conditions such as increasing or decreasing surrounding pressure or increasing or decreasing temperature do not impair the measuring accuracy of the TDR level meter. In addition, the signal's transition time is independent of the dielectric constant of the medium whose level is to be measured.

The TDR measuring principle is thus based on the fact that the transition times—quite short under certain circumstances—of an electromagnetic signal are measured. If the container is almost completely filled with the medium in such a way that the surface of the medium is, for example, only 15 cm below the measuring transducer of the TDR level meter, the entire path of the electromagnetic signal from the measuring transducer to the surface of the medium and back again is only 30 cm, corresponding to a transition time of 1 ns for the short electrical pulse. To be able to measure such short transition times at all, a sampling process is used for which two fast, alternating signals are generated that have a certain frequency difference from each other in the range of a few hertz. Measuring is then carried out in such a way that the measurement is started at a time zero at which the two fast, alternating signals are vibrating in-phase. In this connection, the signal vibrating at the higher frequency indicates the timing for emitting the actual measuring signal, i.e., the short electrical pulse, into the container. Thus, for example, a short electrical pulse is always generated and emitted into the container at the beginning of a period of the signal vibrating at the higher frequency. The signal vibrating at the lower frequency lags behind the signal vibrating at the higher frequency by a certain amount per is vibration period, namely some 4 ps per period for a frequency difference of, e.g., 4 Hz and an oscillation frequency of about 1 MHz for the two signals. This period of 4 ps thus indicates the digital time frame or the digital time base with which the transition time of the short electrical pulse emitted in the container and reflected at the surface of the medium is measured.

While the signal vibrating at the higher frequency indicates the timing for emitting the short electrical pulse into the container, the signal vibrating at the lower frequency determines at what point in time a reflected signal can be detected for an extremely short period. Thus, according to the above-described example, as of the time when the two alternating signals are in-phase, after 1000 vibration periods, a reflected pulse would be detected that would have had a transition time of 4 ns, corresponding to a total path of 1.2 m and thus a level for the medium to be measured of 60 cm under the measuring transducer of the TDR level meter.

Time base generators with essentially the following design have previously been used to generate a time base for a TDR level meter:

With two oscillators that are each operated at an oscillation frequency of several times 10 MHz, a first oscillation signal and a second oscillation signal are generated. These two oscillation signals are divided, on the one hand, by digital frequency dividers with a corresponding frequency division so as to obtain, for example, a signal of 1 MHz and a second signal of 1.000004 MHz, i.e. the first signal and the second signal have a frequency difference of 4 Hz. The oscillation signals of the two oscillators, on the other hand, are fed to a third and a fourth digital frequency divider, respectively, which digitally divide the two oscillation frequencies of the various oscillators so as to obtain a common, identical synchronization frequency from the two different oscillation frequencies. The synchronization frequency generated from the third digital frequency divider and the synchronization frequency generated from the fourth digital frequency divider are fed to a phase indicator which, depending on the phase difference between the two received signals, transmits a voltage to a voltage-controlled oscillator which, in turn, regulates the frequency of the second oscillator in such a way that the frequencies of the two oscillators are in a predetermined, fixed frequency relation to each other, in such a way that the two signals generated and emitted by the time base generator have a predetermined, fixed frequency difference, 4 Hz in the present case. In this way, the permanently preset frequency difference between the two signals is always maintained regardless of frequency changes of the first oscillator, e.g. due to temperature influences. In this connection, it should be noted that due to the ratio of the two signals generated and emitted by the time base generator, which is quite close to 1:1, the maintenance of the permanently preset frequency ratio between the two signals in practical operation, in which only slight fluctuations of the first oscillator's frequency occur due to external influences, also meets the requirement for the frequency difference between the two signals to remain constant.

The principle of such a time base generator is thus based on the fact that the first oscillator is excited with a first frequency but may experience at least slight deviations from its preset value due to ambient influences such as temperature changes. However, since it is essential for the accuracy of the time measurement that there be, relative to the first oscillator's frequency, a precisely predetermined, always constant frequency difference that represents the time frame for the time base, the second oscillator's frequency must also be made to follow accordingly if the first oscillator's frequency changes. For this, the above-described design, in which a PLL (phase locked loop) is used, serves to adjust the frequency of the second oscillator to the proper value in each case. In general, a PLL essentially consists of a phase indicator and a voltage-controlled oscillator. In this connection, the phase indicator obtains, on the one hand, a reference signal to whose frequency the signal in the PLL should be adapted and, on the other hand, a signal from the voltage-controlled oscillator, which can be fed directly or further processed, to the phase indicator. The phase indicator then puts out a voltage signal—depending on the phase difference of the two signals fed to it—to the voltage-controlled oscillator, which signal thus serves to control its output frequency. It is then possible with such a control circuit of a PLL to lock-in a frequency generated in the PLL to another reference frequency. In the present case, the following are components of the PLL: the phase indicator, the voltage-controlled oscillator, the second oscillator as well as the third digital frequency divider, and the frequency of the second oscillator is made to follow in a predetermined, fixed relation to the frequency of the first oscillator, which thus represents the reference frequency.

Most conventional TDR level meters have such a time base generator with a PLL. In this connection, typical oscillation frequencies of the two oscillators are in the 20 to 40 MHz range. With an oscillation frequency in this range, however, the oscillator quartz's power consumption is too great to be able to supply the entire TDR level meter via a two-conductor interface and thus via a two-wire circuit. In this connection, the terms "two-conductor interface" and "two-wire circuit" relate to an arrangement in which the measuring signal is carried and the meter is supplied with electric current via a single two-wire line. In this connection, the measuring signal typically ranges from 4 to 20 mA, and a maximum of 40 mW are typically available for supplying the meter.

To operate the TDR level meter, a reduction of the power consumption of the oscillators—usually made of oscillator quartzes—can be achieved in principle by reducing the oscillation frequencies of the oscillator quartzes, because their power consumption increases roughly linearly with their oscillation frequency. A time base generator circuit in which the power consumption is so low that only one two-conductor interface or one two-wire line is sufficient for the entire TDR level meter for supplying current and for providing measuring values, must meet two requirements: On the one hand, the oscillators' frequencies must be clearly below 10 MHz so that power consumption is not too great, and on the other hand, the synchronization frequencies that are fed to the phase indicator and indicate the timing for readjusting the second oscillator's frequency cannot be less than 1 kHz, because otherwise the system is too sluggish and a stable time base cannot be generated. However, such a time base with sufficiently low oscillation frequencies of the oscillators, on the one hand, and a sufficiently high synchronization frequency, on the other hand, cannot be produced with the conventional PLL circuit.

It is thus the technical problem of the invention to provide an arrangement as well as a method for generating two alternating signals that are in a predetermined, fixed frequency relation to each other, where if one frequency deviates from its target value the other frequency is quickly readjusted and power consumption is low.

SUMMARY OF INVENTION

The technical problem described above is solved according to the invention by an arrangement for generating a first alternating signal and a second alternating signal that is in a predetermined, fixed frequency relation to the first signal, with a first resonator, a second resonator and a third resonator; in this connection, the first resonator delivers an oscillation signal corresponding to its oscillation frequency to a first digital frequency divider which generates the first signal from this, and delivers an oscillation signal corresponding to its oscillation frequency to a second digital frequency divider which generates a first synchronization signal from this; the second resonator delivers an oscillation signal corresponding to its oscillation frequency to a third digital frequency divider which generates a second synchronization signal from this and delivers an oscillation signal corresponding to its oscillation frequency to a fourth digital frequency divider which generates a third synchronization signal from this; the third resonator delivers an oscillation signal corresponding to its oscillation frequency to a fifth digital frequency divider which generates a fourth synchronization signal from this and delivers an oscillation signal corresponding to its oscillation frequency to a sixth digital frequency divider which generates the second signal from this, in connection with which the first synchronization signal and the second synchronization signal are fed to a first phase indicator which, depending on the phase difference between the first synchronization signal and the second synchronization signal, puts out a voltage to a first voltage-controlled oscillator which adjusts the oscillation frequency of the second resonator in such a way that this frequency is in a predetermined relation to the oscillation frequency of the first resonator, and the third synchronization signal and the fourth synchronization signal are fed to a second phase indicator which, depending on the phase difference between the third synchronization signal and the fourth synchronization signal, puts out a voltage to a second voltage-controlled oscillator which adjusts the oscillation frequency of the third resonator in such a way that this frequency is in a predetermined relation to the oscillation frequency of the second resonator.

On the other hand, the technical problem derived and illustrated above is solved according to the invention by a method for generating a first alternating signal and a second alternating signal that is in a predetermined, fixed relation to the first signal, in connection with which a first oscillation signal with a first oscillation frequency, a second oscillation signal with a second oscillation frequency and a third oscillation signal with a third oscillation frequency are generated, and the first signal is generated from the first oscillation signal in that the oscillation frequency of the first oscillation signal is divided integrally by a first frequency division, a first synchronization signal is generated from the first oscillation signal in that the oscillation frequency of the first oscillation signal is divided integrally by a second frequency division, a second synchronization signal is generated from the second oscillation signal in that the oscillation frequency of the second oscillation signal is divided integrally by a third frequency division, a third synchronization signal is generated from the second oscillation signal in that the oscillation frequency of the second oscillation signal is divided integrally by a fourth frequency division, a fourth synchronization signal is generated from the third oscillation signal in that the oscillation frequency of the third oscillation signal is divided integrally by a fifth frequency division, and the second signal is generated from the third oscillation signal in that the oscillation frequency of the third oscillation signal is divided integrally by a sixth frequency division, in connection with which the phase of the first synchronization signal is compared with the phase of the second synchronization signal and, depending on the phase difference between the first synchronization signal and the second synchronization signal, the second oscillation frequency is adjusted in such a way that it is in a predetermined, fixed relation to the first oscillation frequency, and the phase of the third synchronization signal is compared with the phase of the fourth synchronization signal and, depending on the phase difference between the third synchronization signal and the fourth synchronization signal, the third oscillation frequency is adjusted in such a way that it is in a predetermined, fixed relation to the second oscillation frequency.

The invention thereby provides for connecting a second PLL to the first PLL as is also the case in the state of the art, in such a way that with the increased number of digital frequency dividers, even with low oscillation frequencies of the resonator—below 10 MHz—a sufficiently fine time frame of a few Pico seconds can be achieved and the frequency of the second signal with a correspondingly high frequency of more than 1 kHz can still be made to follow the first frequency in the predetermined frequency relation.

The arrangement according to the invention as well as the method according to the invention are preferably further developed in that the frequency of the first alternating signal and the frequency of the second alternating signal are both in the 0.1 to 10 MHz range, preferably about 1 MHz.

Furthermore, the arrangement according to the invention as well as the method according to the invention are preferably further developed in that the predetermined, fixed frequency relation between the first alternating signal and the second alternating signal is chosen in such a way that the difference between the frequency of the first alternating signal and the frequency of the second alternating signal is between 1 and 10 Hz, preferably about 4 Hz. For alternating signals with a frequency of about 1 MHz, a time frame of 4 ps is thus obtained with a difference frequency of 4 Hz.

In the arrangement according to the invention, the first resonator, the second resonator and the third resonator are preferably each formed by an oscillator quartz and accordingly, with the method according to the invention the first oscillation signal, the second oscillation signal and the third oscillation signal are each generated by an oscillator quartz.

As already stated above, the arrangement according to the invention and the method according to the invention are suitable for a TDR level meter, in particular as a time base generator and as a time base generator method, respectively. The arrangement according to the invention and the method according to the invention can, of course, be applied to other devices and applications in which a corresponding digital time base is required.

In detail, there are now a number of possibilities to implement the arrangement and the method according to the invention. Referred to in this respect are the dependent patent claims on the one hand, and the following description of a preferred form of construction of the invention in connection with the drawing, on the other hand.

BRIEF DESCRIPTION OF THE DRAWING

In the drawing, the sole FIGURE shows a schematic diagram of the circuit of the arrangement according to the invention.

DESCRIPTION OF THE PREFERRED EMBODIMENTS

As the FIGURE shows, a first resonator 1, a second resonator 2 and a third resonator 3 are provided according to the preferred embodiment of the invention. In this connection, the first resonator 1 oscillates at an oscillation frequency of 5 MHz, the second resonator 2 oscillates at an oscillation frequency of 3.579545 MHz and the third resonator 3 oscillates at an oscillation frequency of roughly 4 MHz. The arrangement according to the first preferred embodiment of the invention is intended to supply a first alternating signal T with a frequency of 1 MHz and a second alternating signal R with a frequency of roughly 1.000004 MHz. For this purpose, the first resonator 1 delivers an oscillation signal corresponding to its oscillation frequency of 5 MHz to a first digital frequency divider 4 which generates the first signal from this with a frequency of 1 MHz by means of a digital frequency division by 5. On the other hand, the first resonator 1 delivers an oscillation signal corresponding to its oscillation frequency of 5 MHz to a second digital frequency divider 5 which generates a first synchronization signal S1 from this by means of a digital frequency division by 264.

The second resonator 2 delivers an oscillation signal corresponding to its oscillation frequency of 3.579545 MHz to a third digital frequency divider 6 which generates a second synchronization signal S2 from this by means of a digital frequency division by 189. In addition, the second resonator 2 delivers an oscillation signal corresponding to its oscillation frequency of 3.579545 MHz to a fourth digital frequency divider 7 which generates a third synchronization signal S3 from this by means of a digital frequency division by 647. The third resonator 3 delivers an oscillation signal corresponding to its oscillation frequency of roughly 4 MHz to a fifth digital frequency divider 8, which generates a fourth synchronization signal S4 from this by means of a digital frequency division by 723. Finally, the third resonator 3 delivers an oscillation signal corresponding to its oscillation frequency of roughly 4 MHz to a sixth digital frequency divider 9 which generates the second signal R with a frequency of roughly 1.000004 MHz from this by means of a digital frequency division by 4.

The readjustment of the second alternating signal R corresponding to a change of the first alternating signal T, i.e. the maintaining of a predetermined, fixed frequency relation between the first signal T and the second signal R, which, with only limited deviations of the resonator's 1 oscillation frequency of 5 MHz, also corresponds in practice to a fixed, predetermined difference between the frequency of the first alternating signal T and the frequency of the second alternating signal R, takes place according to the invention by means of two consecutive PLLs. For this, according to the first preferred embodiment of the invention, the following are provided for in a first PLL: a phase indicator 10 that receives the first synchronization signal S1 and the second synchronization signal S2, and a voltage-controlled oscillator 11 that is controlled by the phase indicator 10 by means of a voltage U1 and thereby, in turn, adjusts the oscillation frequency of the second resonator 2. Provided in a second PLL are a phase indicator 12 that receives the third synchronization signal S3 and the fourth synchronization signal S4, and a voltage-controlled oscillator 13 that is controlled by the phase indicator 12 by a voltage U2 and, in turn, adjusts the oscillation frequency of the third resonator 3.

In the first PLL, the oscillation frequency of the second resonator 2 is adjusted by the voltage-controlled oscillator 11 in such a way that the phase indicator 10, depending on the phase difference between the first synchronization signal S1 and the second synchronization signal S2, delivers a voltage U1 to the voltage-controlled oscillator 11, such that it adjusts the resonator 2 in such a way its oscillation frequency is in a predetermined relation to the first resonator's 1 oscillation frequency, which, according to the preferred embodiment of the invention as described here, is 3.579545 to 5. This frequency relation was selected because corresponding frequency divisions can be favorably achieved by the second digital frequency divider 5 and, respectively, the third digital frequency divider 6 by digital frequency divisions of 264 and, respectively, 189, without the synchronization frequency of the first PLL being too low in this regard. According to the first preferred embodiment of the invention, namely a first synchronization frequency S1 or, respectively, a second synchronization frequency S2 corresponding to it of roughly 18.9 kHz is obtained. This value is clearly above the value of 1 kHz found in practical experience, at which a sufficiently stable time base can just barely be generated.

The method of operation of the second PLL corresponds essentially to that of the first PLL. While the synchronization signal S3 fed to the phase indicator 12 already represents a signal following a change of the first signal T, information on the vibration deviations of the third resonator 3 from the predetermined, fixed frequency relation of the first signal to the second signal is fed to the phase indicator 12 by the synchronization signal S4. The oscillation frequency of the third resonator 3 is then adjusted according to the adjustment in the first PLL via the voltage U2 emitted by the phase indicator 12 to the voltage-controlled oscillator 13 and a corresponding adjustment of the frequency of the third resonator 3 by the voltage-controlled oscillator 13. According to the oscillation frequency of the second resonator 2 of 3.579545 MHz or, respectively, the oscillation frequency of the third resonator 3 of roughly 4 MHz, the frequency division of the fourth digital frequency divider 7 was selected at 647 and the frequency division of the fifth digital frequency divider 8 at 723. In order to achieve a second signal of roughly 1.000004 MHz, the frequency division of the sixth digital frequency divider 9 is 4.

In this way, a sufficiently high third synchronization frequency S3 or a fourth synchronization frequency S4 corresponding to it, of roughly 5.5 kHz, is obtained in the second PLL as well.

As a result, it should be noted that, contrary to conventional arrangements, an arrangement according to the preferred embodiment of the invention shown in the FIGURE has a substantially lower power consumption level, although an additional oscillator is provided. In factual terms, according to the state of the art, an arrangement was previously used with two oscillators that were operated at oscillation frequencies of 32 MHz and 21 MHz, respectively. Compared to such an arrangement, the arrangement according to the preferred embodiment of the invention has a power consumption level reduced by a factor of 4, in such a way that the measured values can be transferred and an entire TDR level meter having such an arrangement as a time base generator can be supplied with current exclusively via a two-conductor interface or a two-wire line. With respect to protection from explosions, this makes possible a safe design of such a TDR level meter and its supply lines.

What is claimed is:

1. An arrangement for generating a first alternating signal and a second alternating signal that is in a predetermined, fixed frequency relation to the first signal, with a first resonator (1), a second resonator (2) and a third resonator (3); in this connection, the first resonator (1) delivers an oscillation signal corresponding to its oscillation frequency to a first digital frequency divider (4) which generates the first signal from this, and delivers an oscillation signal corresponding to its oscillation frequency to a second digital frequency divider (5) which generates a first synchronization signal from this; the second resonator (2) delivers an oscillation signal corresponding to its oscillation frequency to a third digital frequency divider (6) which generates a second synchronization signal from this and delivers an oscillation signal corresponding to its oscillation frequency to a fourth digital frequency divider (7) which generates a third synchronization signal from this; the third resonator (3) delivers an oscillation signal corresponding to its oscillation frequency to a fifth digital frequency divider (8) which generates a fourth synchronization signal from this and delivers an oscillation signal corresponding to its oscillation frequency to a sixth digital frequency divider (9) which generates the second signal from this, in connection with which the first synchronization signal and the second synchronization signal are fed to a first phase indicator (10) which, depending on the phase difference between the first synchronization signal and the second synchronization signal, emits a voltage to a first voltage-controlled oscillator (11) which adjusts the second resonator's (2) oscillation frequency in such a way that it is in a predetermined relation to the oscillation frequency of the first resonator (1), and the third synchronization signal and the fourth synchronization signal are fed to a second phase indicator (12) which, depending on the phase difference between the third synchronization signal and the fourth synchronization signal, emits a voltage to a second voltage-controlled oscillator (13) which adjusts the third resonator's (3) oscillation frequency in such a way that it is in a predetermined relation to the oscillation frequency of the second resonator (2).

2. The arrangement according to claim 1, characterized in that the frequency of the first alternating signal and the frequency of the second alternating signal are both in the 0.1 to 10 MHz range.

3. The arrangement according to claim 1 or 2, characterized in that the predetermined, fixed frequency relation between the first alternating signal and the second alternating signal is chosen in such a way that the difference between the frequency of the first alternating signal and the frequency of the second alternating signal is between 1 and 10 Hz.

4. The arrangement according to claim 1 or 2, characterized in that the oscillation frequency of the first resonator (1) is 5 MHz, the oscillation frequency of the second resonator (2) is 3.579545 MHz, the oscillation frequency of the third resonator (3) is roughly 4 MHz, the frequency division of the first digital frequency divider (4) is 5, the frequency division of the second digital frequency divider (5) is 264, the frequency division of the third frequency divider (6) is 189, the frequency division of the fourth digital frequency divider (7) is 647, the frequency division of the fifth digital frequency divider (8) is 723 and the frequency division of the sixth digital frequency divider (9) is 4.

5. The arrangement according to claim 1 or 2, characterized in that the first resonator (1), the second resonator (2) and the third resonator (3) each comprise an oscillator quartz.

6. A time base generator with an arrangement according to claim 1 or 2.

7. A method for generating a first alternating signal and a second alternating signal that is in a predetermined, fixed relation to the first signal, in connection with which a first oscillation signal with a first oscillation frequency, a second oscillation signal with a second oscillation frequency and a third oscillation signal with a third oscillation frequency are generated, and the first signal is generated from the first oscillation signal in that the oscillation frequency of the first oscillation signal is divided integrally by a first frequency division, a first synchronization signal is generated from the first oscillation signal in that the oscillation frequency of the first oscillation signal is divided integrally by a second frequency division, a second synchronization signal is generated from the second oscillation signal in that the oscillation frequency of the second oscillation signal is divided integrally by a third frequency division, a third synchronization signal is generated from the second oscillation signal in that the oscillation frequency of the second oscillation signal is divided integrally by a fourth frequency division, a fourth synchronization signal is generated from the third oscillation signal in that the oscillation frequency of the third oscillation signal is divided integrally by a fifth frequency division, and the second signal is generated from the third oscillation signal in that the oscillation frequency of the third oscillation signal is divided integrally by a sixth frequency division, in connection with which the phase of the first synchronization signal is compared with the phase of the second synchronization signal and, depending on the phase difference between the first synchronization signal and the second synchronization signal, the second oscillation frequency is adjusted in such a way that it is in a predetermined, fixed relation to the first oscillation frequency, and the phase of the third synchronization signal is compared with the phase of the fourth synchronization signal and, depending on the phase difference between the third synchronization signal and the fourth synchronization signal, the third oscillation frequency is adjusted in such a way that it is in a predetermined, fixed relation to the second oscillation frequency.

8. A method according to claim 7, characterized in that the frequency of the first alternating signal and the frequency of the second alternating signal are both in the 0.1 to 10 MHz range, preferably about 1 MHz.

9. The method according to claim 7 or 8, characterized in that the predetermined, fixed frequency relation between the first alternating signal and the second alternating signal is chosen in such a way that the difference between the frequency of the first signal and the frequency of the second signal is between 1 and 10 Hz, preferably about 4 Hz.

10. The method according to claim 7 or 8, characterized in that the first oscillation frequency is 5 MHz, the second oscillation frequency is 3.579545 MHz, the third oscillation frequency is roughly 4 MHz, the first frequency division is 5, the second frequency division is 264, the third frequency division is 189, the fourth frequency division is 647, the fifth frequency division is 723 and the sixth frequency division is 4.

11. The method according to claim 7 or 8, characterized in that the first oscillation signal, the second oscillation signal and the third oscillation signal are each generated by an oscillator quartz.

12. A level meter comprising an arrangement for generating a first alternating signal and a second alternating signal that is in a predetermined, fixed frequency relation to the first signal, with a first resonator (1), a second resonator (2) and a third resonator (3); in this connection, the first resonator (1) delivers an oscillation signal corresponding to its oscillation frequency to a first digital frequency divider (4) which generates the first signal from this, and delivers an oscillation signal corresponding to its oscillation frequency to a second digital frequency divider (5) which generates a first synchronization signal from this; the second resonator (2) delivers an oscillation signal corresponding to its oscillation frequency to a third digital frequency divider (6) which generates a second synchronization signal from this and delivers an oscillation signal corresponding to its oscillation frequency to a fourth digital frequency divider (7) which generates a third synchronization signal from this; the third resonator (3) delivers an oscillation signal corresponding to its oscillation frequency to a fifth digital frequency divider (8) which generates a fourth synchronization signal from this and delivers an oscillation signal corresponding to its oscillation frequency to a sixth digital frequency divider (9) which generates the second signal from this, in connection with which the first synchronization signal and the second synchronization signal are fed to a first phase indicator (10) which, depending on the phase difference between the first synchronization signal and the second synchronization signal, emits a voltage to a first voltage-controlled oscillator (11) which adjusts the second resonator's (2) oscillation frequency in such a way that it is in a predetermined relation to the oscillation frequency of the first resonator (1), and the third synchronization signal and the fourth synchronization signal are fed to a second phase indicator (12) which, depending on the phase difference between the third synchronization signal and the fourth synchronization signal, emits a voltage to a second voltage-controlled oscillator (13) which adjusts the third resonator's (3) oscillation frequency in such a way that it is in a predetermined relation to the oscillation frequency of the second resonator (2).

13. The level meter according to claim 12, characterized in that the measuring data are transferred and the electric current for the level meter is supplied exclusively via a two-wire line.

14. A method for producing a time base for a level meter comprising steps of generating a first alternating signal and a second alternating signal that is in a predetermined, fixed relation to the first signal, in connection with which a first oscillation signal with a first oscillation frequency, a second oscillation signal with a second oscillation frequency and a third oscillation signal with a third oscillation frequency are generated, and the first signal is generated from the first oscillation signal in that the oscillation frequency of the first oscillation signal is divided integrally by a first frequency division, a first synchronization signal is generated from the first oscillation signal in that the oscillation frequency of the first oscillation signal is divided integrally by a second frequency division, a second synchronization signal is generated from the second oscillation signal in that the oscillation frequency of the second oscillation signal is divided integrally by a third frequency division, a third synchronization signal is generated from the second oscillation signal in that the oscillation frequency of the second oscillation signal is divided integrally by a fourth frequency division, a fourth synchronization signal is generated from the third oscillation signal in that the oscillation frequency of the third oscillation signal is divided integrally by a fifth frequency division, and the second signal is generated from the third oscillation signal in that the oscillation frequency of the third oscillation signal is divided integrally by a sixth frequency division, in connection with which the phase of the first synchronization signal is compared with the phase of the second synchronization signal and, depending on the phase difference between the first synchronization signal and the second synchronization signal, the second oscillation frequency is adjusted in such a way that it is in a predetermined, fixed relation to the first oscillation frequency, and the phase of the third synchronization signal is compared with the phase of the fourth synchronization signal and, depending on the phase difference between the third synchronization signal and the fourth synchronization signal, the third oscillation frequency is adjusted in such a way that it is in a predetermined, fixed relation to the second oscillation frequency.

* * * * *